(12) United States Patent (10) Patent No.: US 7,410,903 B2
Subramanian (45) Date of Patent: Aug. 12, 2008

(54) METHODS OF PATTERNING SUBSTRATES

(75) Inventor: Krupakar M. Subramanian, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 309 days.

(21) Appl. No.: 11/197,877

(22) Filed: Aug. 5, 2005

(65) Prior Publication Data

US 2007/0031762 A1 Feb. 8, 2007

(51) Int. Cl.
*H01L 21/311* (2006.01)
(52) U.S. Cl. .................. 438/694; 438/758; 438/795; 438/800; 257/E21.002
(58) Field of Classification Search .............. 438/694, 438/758, 795, 800
See application file for complete search history.

(56) References Cited

U.S. PATENT DOCUMENTS 6,139,626 A * 10/2000 Norris et al. ................ 428/323

OTHER PUBLICATIONS

Warrier, M. et al., "Photocatalytic Reduction of Aromatic Azides to Amines Using CdS and CdSe Nanoparticles", Photochem. Photobiol. Sci., 2004, 3, pp. 859-863.
Warrier, M. et al., Supporting Information "Photocatalytic Reduction of Aromatic Azides to Amines Using CdS and CdSe Nanoparticles", reprinted from website http://www.rsc.org/suppdata/pp/b4/b404268a, printed Jul. 25, 2006, 13 pages.
Egger, S. et al., "Dynamic Shadow Mask Technique: A Universal Tool for Nanoscience", Nano Letters vol. 5, No. 1 (2005), pp. 15-20.
Radhakrishnan, C. et al., "Photocatalytic Reduction of an Azide-Terminated Self-Assembled Monolayer Using CdS Quantum Dots", Langmuir, vol. 22, No. 11 (2006), pp. 5018-5024.

* cited by examiner

*Primary Examiner*—Zandra Smith
*Assistant Examiner*—Christy L Novacek
(74) *Attorney, Agent, or Firm*—Wells St. John P.S.

(57) ABSTRACT

The invention includes a template comprising one or both of CdS and CdSe adhered to a base in a desired pattern. The base can be any transparent or translucent material, and the desired pattern can include two or more separated segments. The template can be utilized for patterning a plurality of substrates. For instance, the substrates can be provided to have masking layers thereover, and the CdS and/or CdSe can be utilized as catalytic material to sequentially impart patterns in the masking layers. The imparting of the patterns can modify some regions of the masking layers relative to others, and either the modified or unmodified regions can be selectively removed to form patterned masks from the masking layers. Patterns from the patterned masks can then be transferred into the substrates.

22 Claims, 8 Drawing Sheets

METHODS OF PATTERNING SUBSTRATES

TECHNICAL FIELD

The invention pertains to methods of patterning substrates utilizing catalytic material comprising one or both of CdS and CdSe; and pertains to templates comprising one or both of CdS and CdSe.

BACKGROUND OF THE INVENTION

There are numerous applications in which it is desired to accurately form patterns across surfaces. For instance, semiconductor processing frequently involves formation of patterns across various surfaces associated with a semiconductor substrate. Photolithography is currently commonly utilized for creating the tiny and highly-detailed patterns associated with semiconductor processing. However, the limits of photolithography are being reached as semiconductor circuitry becomes ever more highly integrated. It is therefore desired to develop new methods of patterning surfaces which can enable very small features to be reproducibly and accurately formed. Although the invention discussed herein was motivated, at least in part, by a desire to improve patterning during semiconductor processing, it is to be understood that the invention can also have applications beyond semiconductor processing.

SUMMARY OF THE INVENTION

In one aspect, the invention includes a method of patterning a substrate. A masking layer is provided over the substrate. A template is provided which comprises patterned catalytic material. The catalytic material comprise one or both of CdS and CdSe. The catalytic material is utilized to modify some regions of the masking layer while leaving other regions unmodified. One of the modified and unmodified regions is selectively removed relative to the other to form a patterned mask from the masking layer. A pattern from the patterned mask is transferred into the substrate.

In one aspect, the invention includes a method of patterning a plurality of substrates. A template is formed which comprises patterned catalytic material bonded to a base. The patterned catalytic material comprises one or both of CdS and CdSe. A plurality of substrates is provided to have masking layers thereover. The catalytic material is utilized to sequentially impart patterns in the masking layers of the substrates. The imparting of the patterns comprises modifying some regions of the masking layers while leaving other regions unmodified. The modified or unmodified regions are selectively removed to form patterned masks from the masking layers. Patterns from the patterned masks are transferred into the substrates.

In one aspect, the invention includes a method of forming a template in which one or both of CdS and CdSe is adhered to a quartz base (or any other suitably transparent or translucent base) in a desired pattern.

In one aspect, the invention includes a template comprising one or both of CdS and CdSe adhered to a quartz base (or any other suitably transparent or translucent base) in a pattern comprising two or more separated segments.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

It has been found that CdS and CdSe can be utilized as catalysts in photocatalytic reduction reactions. The present invention takes advantage of such properties of CdS and CdSe to form templates which can be utilized for patterning masking layers. The patterned masking layers can then be utilized for patterning underlying materials. Exemplary aspects of the invention are described with reference to FIGS. 1-18.

Figure 1:
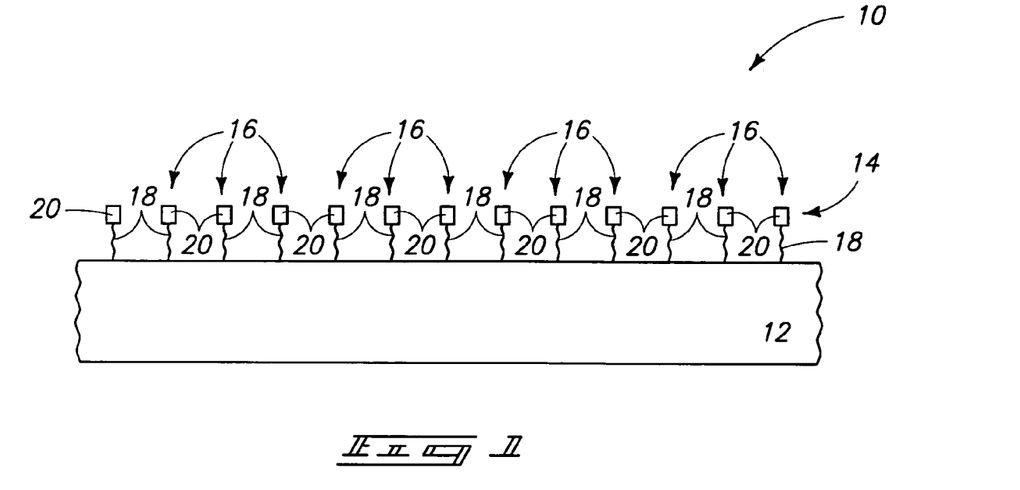
FIG. 1 is a diagrammatic, cross-sectional view of an assembly comprising a substrate and a masking layer, in accordance with an aspect of the present invention.

Referring first to FIG. 1, such shows a fragment of an assembly 10 comprising a substrate 12 having a masking layer 14 thereover. The masking layer is shown to comprise a plurality of molecular units 16. The molecular units individually comprise tails 18 bonded to the substrate 12, and heads 20 attached to the tails.

The tails can comprise any chain suitable for bonding to an upper surface of the substrate 12. For instance, if the substrate 12 comprises a silicon-containing upper surface, the tails 18 can comprise carbon chains bonded to the upper surface of the substrate 12 through oxygen or any other chemical constituent suitable for attaching the tails to the silicon.

The heads 20 comprise molecular groups which can be photocatalytically reduced by one or both of CdS and CdSe, and in exemplary aspects can comprise azides. The heads 20 can be chemically attached to the tails 18 through any appropriate chemical bond. For instance, in some aspects the heads 20 will comprise phenyl azides, and the tails 18 will comprise carbon chains bonded to the phenyl groups of the phenyl azide heads 20.

The substrate 12 can comprise any material which is ultimately desired to be patterned, and in particular aspects will correspond to a semiconductor substrate. For instance, substrate 12 can comprise, consist essentially of, or consist of monocrystalline silicon lightly-doped with background p-type dopant. Substrate 12 can additionally, or alternatively, comprise various layers associated with fabrication of integrated circuitry. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Figure 2:
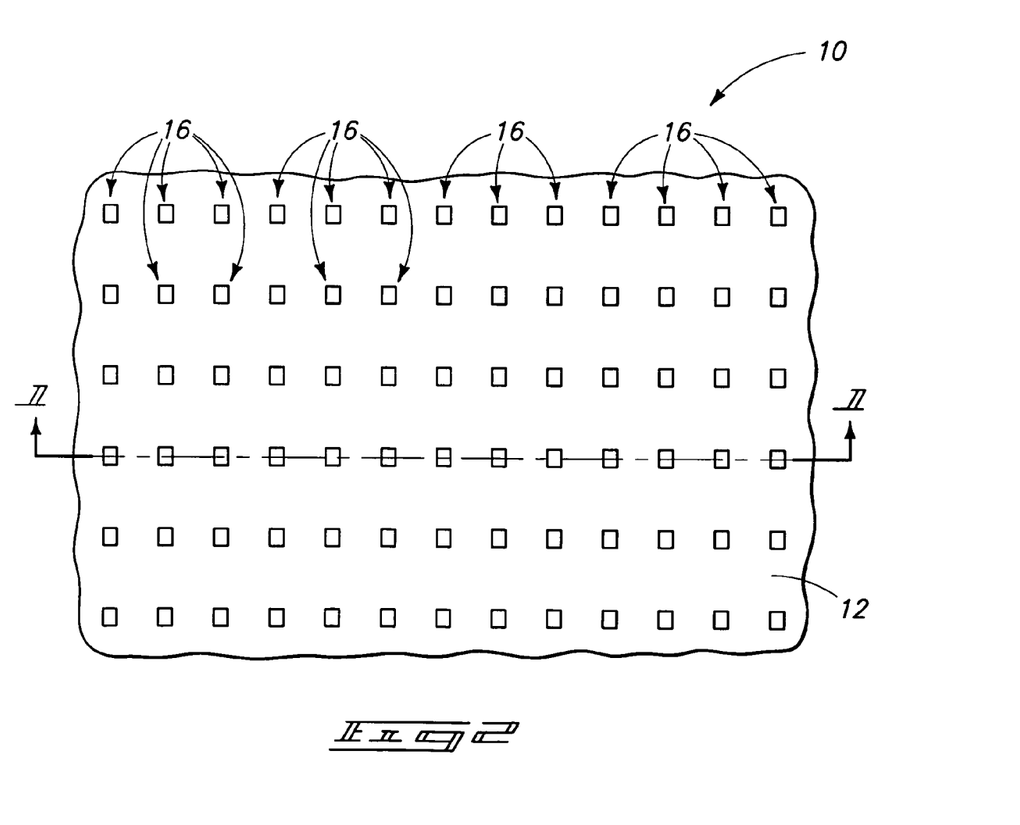
FIG. 2 is a top view of a fragment of the FIG. 1 assembly, with the cross-section of FIG. 1 being along the line 1-1 of FIG. 2.

FIG. 2 is a top view of the assembly 10, and shows that the molecular units 16 (only some of which are labeled) of the masking layer can be orderly arranged across the surface of the substrate 12.

Figure 3:
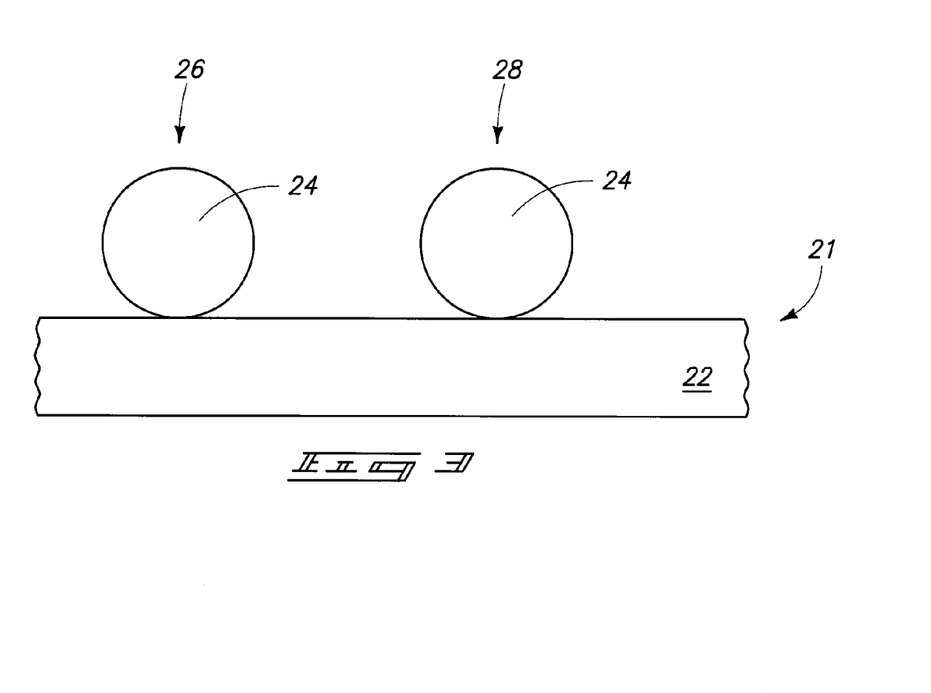
FIG. 3 is a diagrammatic, cross-sectional view of a template in accordance with an aspect of the present invention.

Referring next to FIG. 3, a fragment of a template 21 is illustrated. The template comprises a base 22 having patterned catalytic material 24 bonded thereto. The base 22 can comprise any suitable composition or combination of compositions, and preferably is at least partially transparent to light which will ultimately be utilized for a photocatalytic reduction during subsequent processing. In particular aspects, base 22 can comprise, consist essentially of, or consist of quartz. In some aspects of the invention, base 22 can be considered a substrate which supports the patterned catalytic material 24. In such aspects, base 22 can be referred to as a second substrate to distinguish the base 22 from the first substrate 12 discussed above with reference to FIGS. 1 and 2.

The catalytic material 24 can comprise any suitable composition or combination of compositions, and typically will comprise, consist essentially of, or consist of one or both of CdS and CdSe. The catalytic material 24 is shown formed into a pair of separated segments 26 and 28. Although the segments are shown having circular cross-sections, it is to be understood that the cross-sections can have any suitable geometry, including, for example, elliptical, square or rectangular geometries.

The catalytic material can be bonded to substrate 22 through any appropriate means. In some aspects, material 24 will adhere to an upper surface of substrate 22 through van der Waals forces, and in such aspects can be adhered to the surface of substrate 12 through the van der Waals forces either alone, or at least substantially primarily through the van der Waals forces. In other aspects, an adhesive material can be provided to adhere catalytic material 24 to base 22, and/or openings can be provided to retain catalytic material 24 relative to base 22. Such other aspects are discussed below with reference to FIGS. 14-18.

Figure 4:
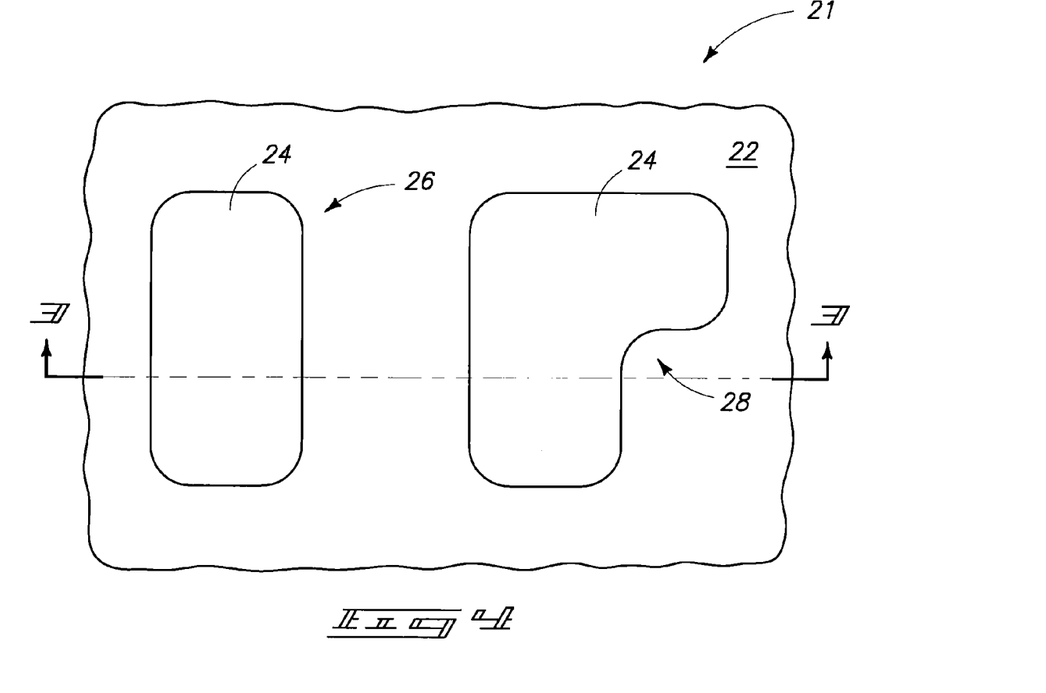
FIG. 4 is a top view of a fragment of the FIG. 3 template, with the FIG. 3 cross-section being along the line 3-3 of FIG. 4.

FIG. 4 shows a top view of the template 21 of FIG. 3. Such top view shows the separate segments 26 and 28 of material 24 extending across base 22. The catalytic material 24 can be patterned into any desired configuration, and accordingly can be patterned into configurations having more than two separated segments, or having only a single continuous segment. In some aspects, the features formed from catalytic material 24 can be very small, and can be on the order of nano-features (in other words, can have at least some dimensions formed to be 100 nanometers or less in size). In particular aspects, the features can be configured to be utilized for forming ultra-small patterns associated with nanoelectronics, such as, for example, patterns having feature sizes on the order of from about 2 nanometers to about 5 nanometers, such as would be utilized for forming quantum dots or quantum wires.

It is noted that the FIG. 4 view implies that some of material 24 of segment 28 should be visible in FIG. 3 behind the plane of the FIG. 3 cross-section. However, in order to focus the drawings on relevant aspects of the invention, only materials within the planes of the cross-sectional views of the drawings are shown, rather than also showing material behind the planes of the cross-sectional views of the drawings.

Figure 5:
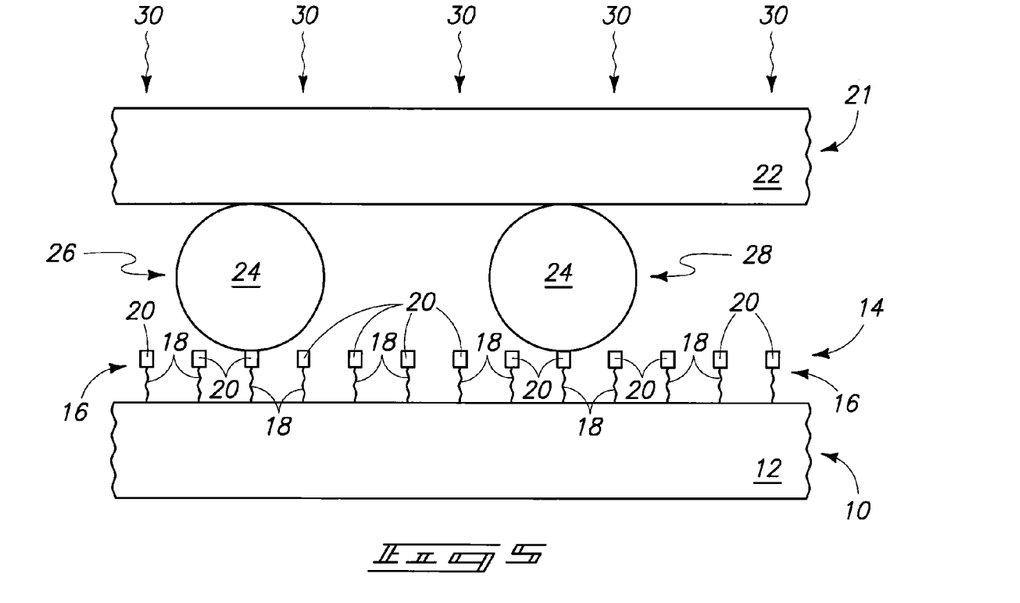
FIG. 5 is a diagrammatic, cross-sectional view of a processing stage in which the template of FIG. 3 is provided proximate the assembly of FIG. 1.

Referring to FIG. 5, template 21 is shown inverted and provided proximate assembly 10. Accordingly, patterned catalytic material 24 is within catalytic proximity to some of the reactive heads 20 of units 16.

Light 30 is projected through base 22. The light, together with catalyst 24, causes photocatalytic reaction of the groups 20 within catalytic proximity to catalyst 24. Light 30 can comprise any suitable wavelength. In aspects in which groups 20 comprise azide, and the photocatalytic reaction is a photocatalytic reduction of the azide to an amine, the light can comprise a wavelength of from about 300 nanometers to about 450 nanometers, with an exemplary wavelength being about 360 nanometers when utilizing CdS, and an exemplary wavelength being about 420 nanometers when utilizing CdSe.

An oxidizable material can be provided adjacent groups 20 during the photo-reduction, with an exemplary oxidizable material being sodium formate. The sodium formate can be provided in an aqueous solution. In particular aspects, such aqueous solution will be provided at least between base 22 and substrate 12 during the photo-reduction of reactive groups 20, and in some aspects the entirety of template 20 and substrate 10 can be dipped within an aqueous solution during the photo-reduction.

Figure 6:
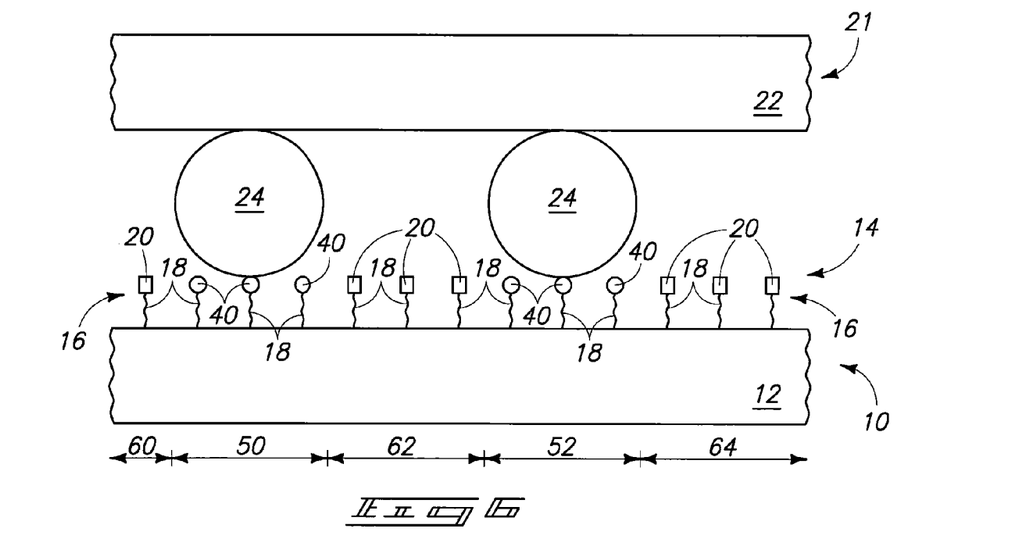
FIG. 6 is a view of the template and assembly of FIG. 5 shown at a processing stage subsequent to that of FIG. 5.

Referring to FIG. 6, the head groups 20 proximate catalyst 24 are shown modified into groups 40 by the photoreaction discussed above with reference to FIG. 5. Such modification is diagrammatically illustrated by a change in the geometric shape representing the head groups from a square shape corresponding to the unmodified groups 20 to a circular shape corresponding to the modified groups 40. In some aspects, the modified groups can become bonded or otherwise linked to one another, and in other aspects the modified groups can remain non-linked to one another.

The modification of some of the molecular units 16 creates modified regions 50 and 52 of the masking layer 14, while leaving regions 60, 62 and 64 unmodified.

Figure 7:
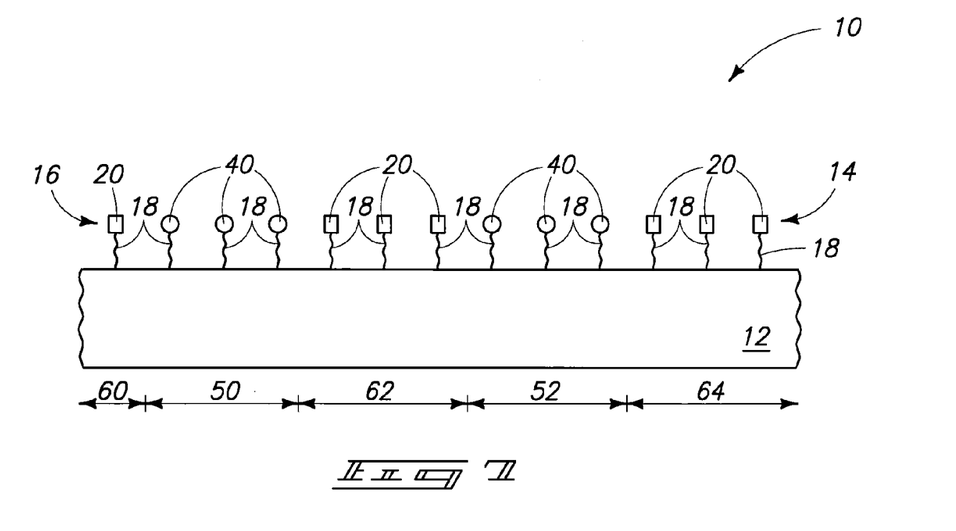
FIG. 7 is a view of the assembly of FIG. 1 shown at a processing stage subsequent to that of FIG. 6.

Referring to FIG. 7, template 21 (FIG. 6) is removed. The remaining assembly 10 comprises the masking layer 14 having the modified regions 50 and 52, and unmodified regions 60, 62 and 64; with the modified regions comprising modified head groups 40, and the unmodified regions comprising unmodified head groups 20.

Figure 8:
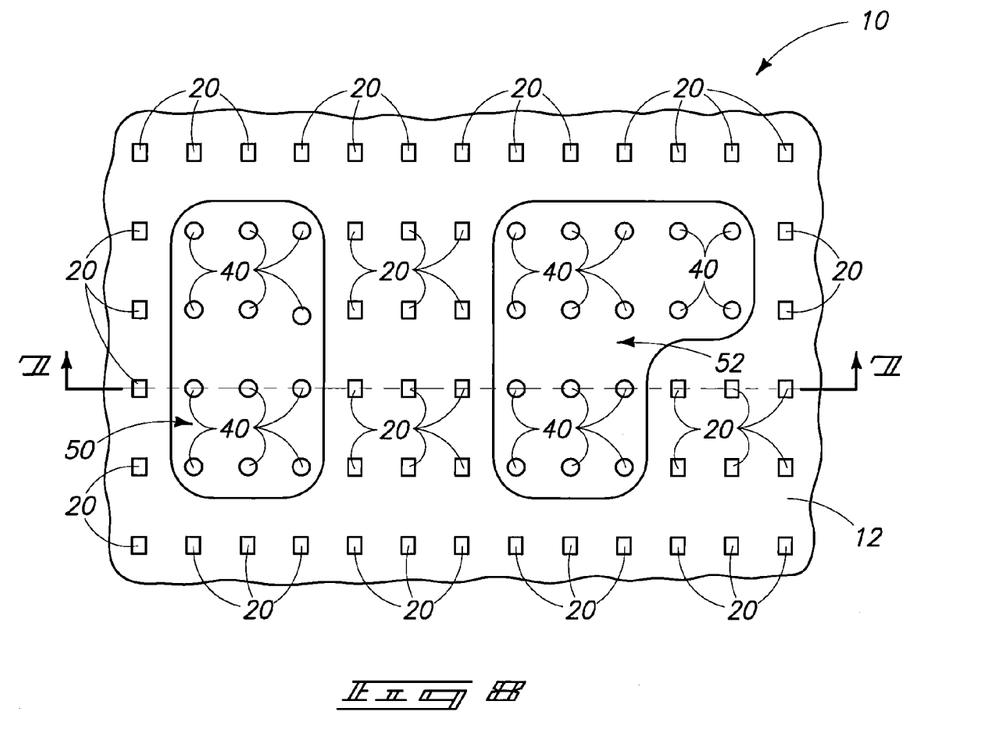
FIG. 8 is a top view of a fragment of the FIG. 7 assembly, with the cross-section of FIG. 7 being along the line 7-7.

FIG. 8 shows a top view of the assembly 10 comprising the FIG. 7 cross-section. Such top view shows that the modified groups 40 define modified regions which correspond approximately to the pattern of catalytic material 24 on the template 21. Specifically, the modified regions 50 and 52 correspond approximately to the patterns 26 and 28 shown for the catalytic material 24 in the top view of the template of FIG. 4.

Figure 9:
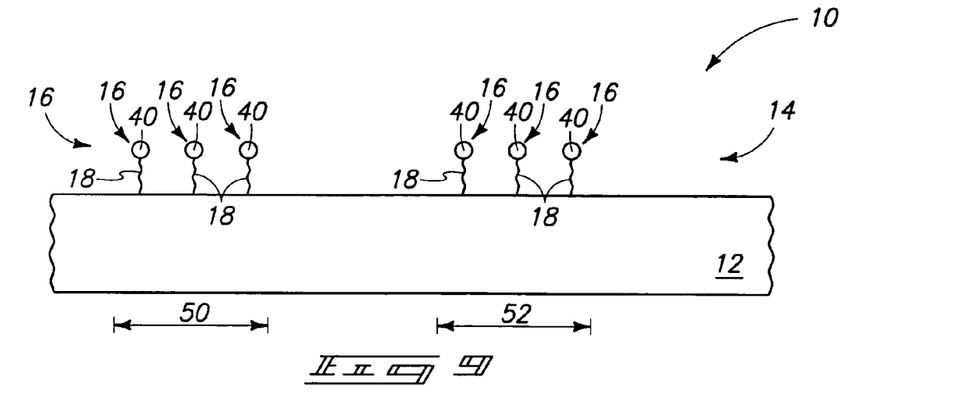
FIG. 9 is a view of the FIG. 1 assembly shown at a processing stage subsequent to that of FIG. 7.

The masking layer 14 comprising the modified and unmodified groups can be patterned by selectively removing one of the modified and unmodified groups relative to the other of the modified and unmodified groups. For instance, FIG. 9 shows the masking layer 14 after the selective removal of the unmodified groups 20 relative to the modified groups 40. In aspects in which the unmodified groups comprise azide and the modified groups comprise amines, selective removal of the azide-containing groups relative to the amine-containing groups can be accomplished with any suitable etch chemistry, which can include either wet etch chemistries or dry etch chemistries.

The removal illustrated in FIGS. 8 and 9 has removed the entirety of the unmodified units 16, and accordingly has removed the head groups 20 and the tails 18 of such unmodified units. It is to be understood that the invention also encompasses aspects in which only the head groups are removed and the tails remain. Regardless, chemical differences between the modified units 16 and unmodified units enable at least portions of the unmodified units to be selectively removed relative to the modified units, or vice versa.

The selective removal of at least portions of the modified or unmodified units relative to the other of the modified and unmodified units can be referred to as selective removal of one of the modified and unmodified regions relative to the other of the modified and unmodified regions of the FIG. 7 assembly (with the modified regions being regions 50 and 52, and the unmodified regions being 60, 62 and 64), to form a patterned mask from the masking layer 14.

Figure 10:
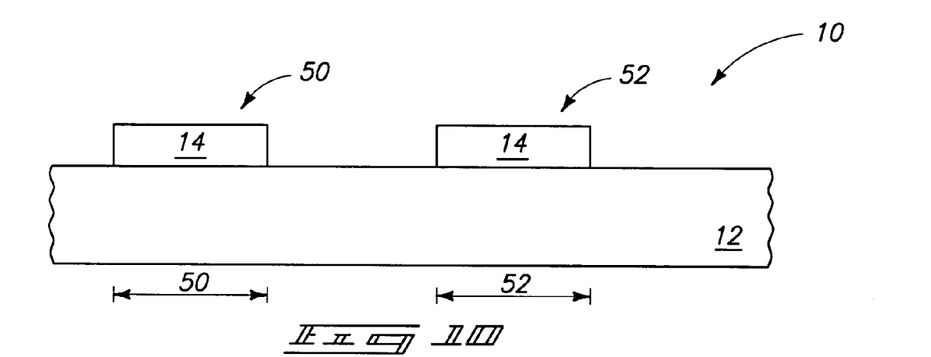
FIG. 10 is a view of the FIG. 9 assembly illustrated in an alternative manner relative to the illustration of FIG. 9.

FIG. 10 shows an alternative diagrammatic view of the assembly 10 of FIG. 9. The view of FIG. 10 shows the regions 50 and 52 of the patterned masking layer 14 as a pair of segments 50 and 52 over substrate 12, rather than showing the individual units 16 of the masking layer. The diagrammatic representation of FIG. 10 will be utilized in the discussion that follows regarding utilization of the patterned masking layer 14 for patterning the underlying substrate 12.

Figure 11:
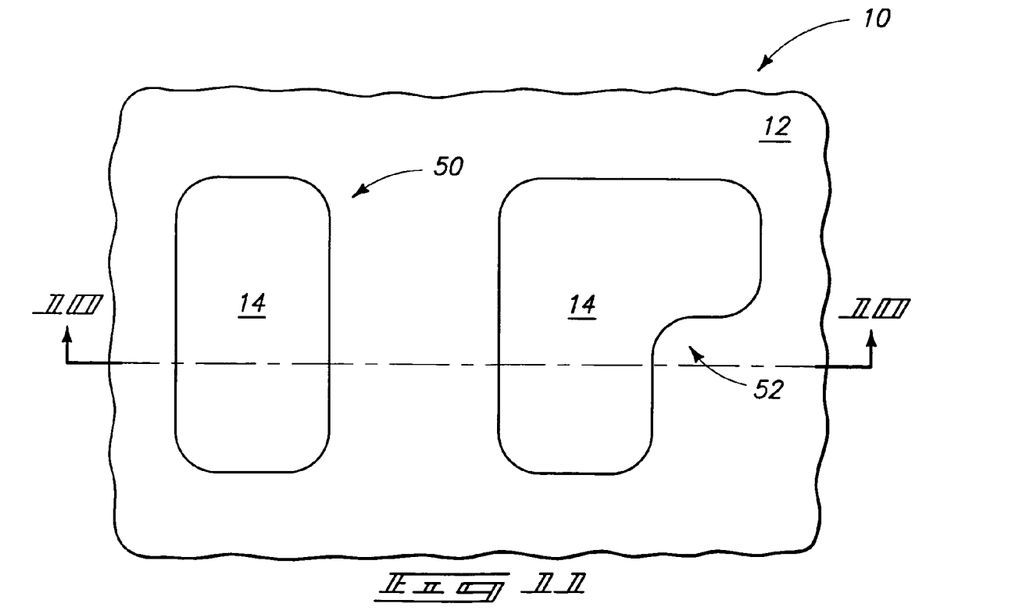
FIG. 11 is a top view of a fragment of the FIG. 10 assembly, with the cross-section of FIG. 10 being along the line 10-10 of FIG. 11.

FIG. 11 shows a top view of the FIG. 10 assembly, and shows the patterned segments 50 and 52 having shapes substantially corresponding to the shapes of the catalytic material segments 26 and 28 of the template 21 of FIG. 3.

Figure 12:
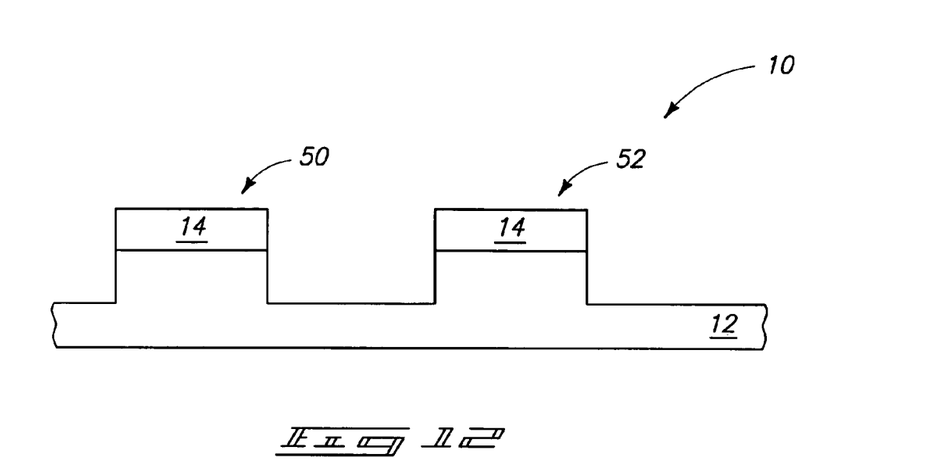
FIG. 12 is a view of the FIG. 10 assembly shown at a processing stage subsequent to that of FIG. 10.
Figure 13:
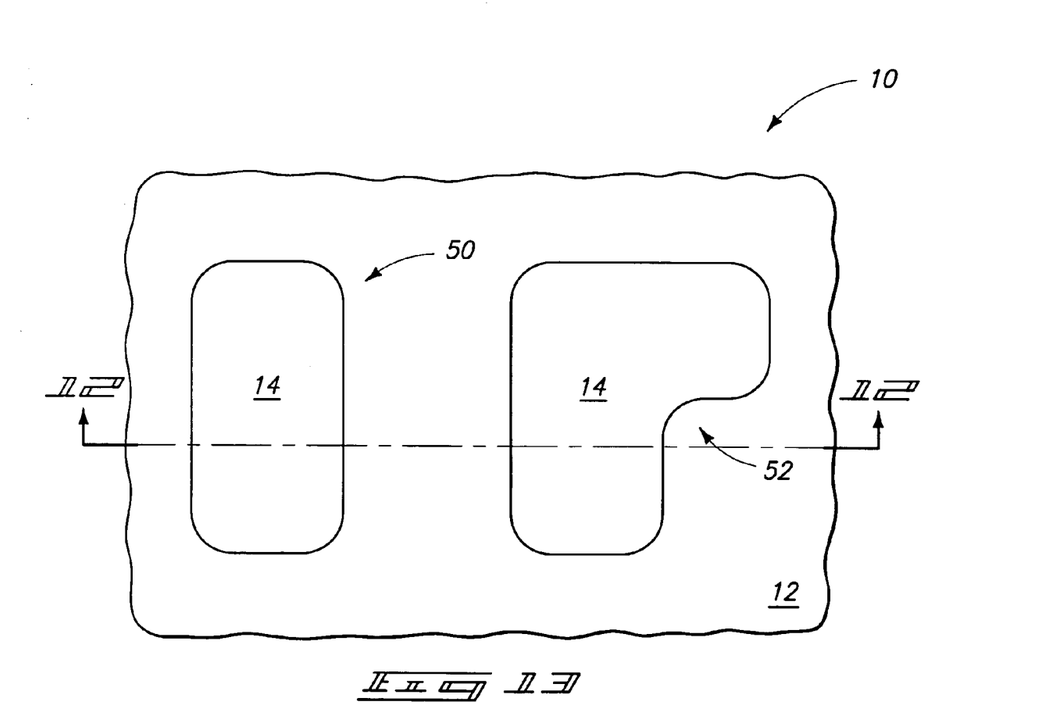
FIG. 13 is a top view of a fragment comprising the FIG. 12 cross-section along the line 12-12.

Referring to FIGS. 12 and 13, assembly 10 is shown at a processing stage after an appropriate etch has been conducted to transfer a pattern from the patterned masking layer 14 into the underlying substrate 12. In particular aspects, substrate 12 can comprise a semiconductor substrate, and the etch of FIG. 10 can transfer the pattern from patterned mask 14 into semiconductor material of the semiconductor substrate. For instance, substrate 12 can comprise, consist essentially of, or consist of monocrystalline silicon, and the etch can transfer the pattern into the monocrystalline silicon of the substrate. The etch can comprise any suitable chemistry which is substantially selective for the material of substrate 12 relative to the material of masking layer 14.

As discussed previously, a semiconductor substrate can comprise various layers in addition to a semiconductor material. For instance, a semiconductor substrate can comprise various insulative material layers and/or conductive material layers over a semiconductor substrate. In some aspects, the patterned mask 14 can be utilized for patterning various insulative material layers and/or conductive material layers associated with a semiconductor substrate. In such aspects, suitable etch chemistry can be chosen such that the chemistry is selective for the conductive and/or insulative materials which are to be etched relative to the masking material 14. The term "selective" is utilized to indicate that the etch removes the conductive and/or insulative materials at a faster rate than it removes the masking material 14, which can include, but is not limited to, etches which are 100% selective for the conductive and/or insulative materials relative to the masking material 14.

The masking material 14 can be removed from over substrate 12 at a subsequent processing step (not shown), and substrate 12 can then be utilized for fabrication of various materials thereover. For instance, if substrate 12 comprises a semiconductor substrate, the substrate can subsequently be utilized for fabrication of integrated circuitry within the patterned regions formed through utilization of masking material 14.

Among the advantages of methodology of the present invention is that a single template can be utilized for producing numerous repeats of a desired pattern. For instance, the template can be utilized iteratively across a single substrate to form a repeating pattern across such substrate. In particular aspects, the template can be utilized to form a repeating pattern across a semiconductor wafer substrate. Alternatively, or additionally, the template can be utilized for forming the same pattern across multiple semiconductor substrates sequentially relative to one another.

Figure 14:
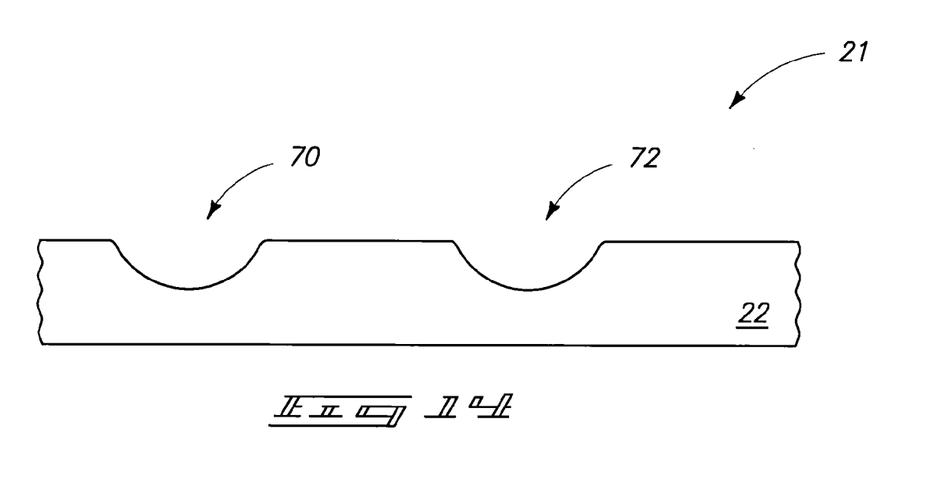
FIG. 14 is a diagrammatic, cross-sectional view of a template shown at a preliminary processing stage in accordance with an exemplary aspect of the present invention.

As discussed previously with reference to FIG. 3, catalytic material 24 can be adhered to substrate 22 through any of numerous appropriate methods. One such method is simply to use Van der Waals forces to retain the catalytic material on the base 22. The catalytic material can be provided into appropriate locations across the base utilizing electrostatic-forces to move the catalytic material into its desired locations, and then fixed to such locations with the van der Waals forces. Utilization of an electric field and electrostatic forces to move the catalytic materials can enable complex, user-defined patterns to be formed from the catalytic materials. In some aspects, the placement of the catalytic materials into desired locations on a substrate (or base) 22 can be enhanced by providing wells within the substrate to retain the catalytic material. For instance, FIG. 14 shows a substrate 22 at a preliminary stage during fabrication of a template 21. The substrate 22 has a pair of wells 70 and 72 formed therein. The wells can be formed by any suitable processing, including, for example, a laser etch. The wells 70 and 72 are at locations where it is desired to adhere catalytic material to the base 22.

Figure 15:
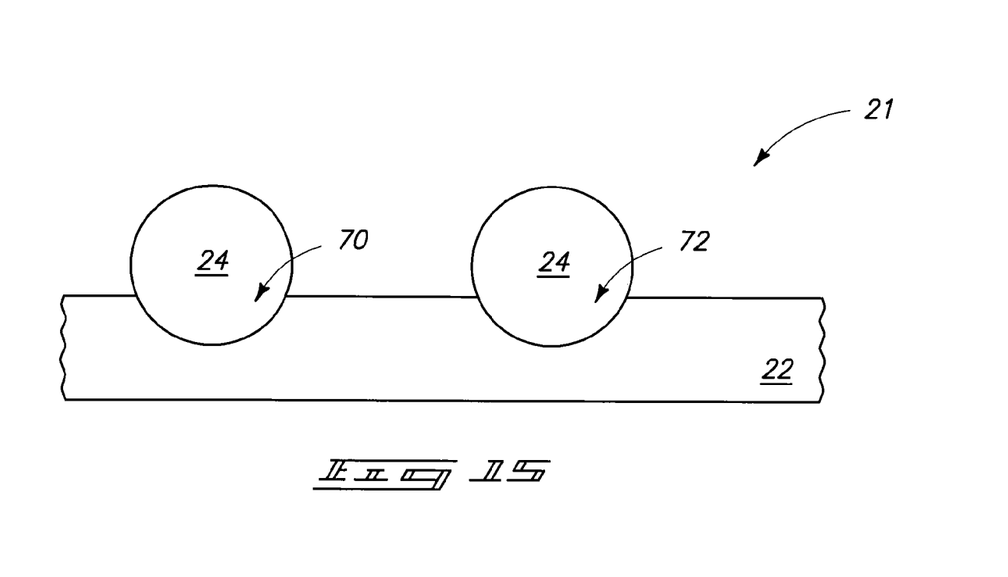
FIG. 15 is a view of the FIG. 14 template shown at a processing stage subsequent to that of FIG. 14.

FIG. 15 shows the template 21 after provision of catalytic material 24 within the wells 70 and 72. The wells 70 and 72 can assist in precisely placing catalytic material 24 in desired locations across template 22. Further, the wells 70 and 72 can assist in retaining material 24 to base 22, in that the wells provide additional surface area for van der Waals forces to occur between the catalytic material 24 and the base 22. Additionally, the wells can assist in fixing the catalytic material to the desired locations, in that the wells can prevent the catalytic material from migrating across the surface of base 22.

In some aspects, van der Waals forces alone are not sufficient for retaining catalytic material 24 to base 22. In such aspects, a layer of adhesive material can be provided between the base and the catalytic material to adhere the catalytic material to the base.

Figure 16:
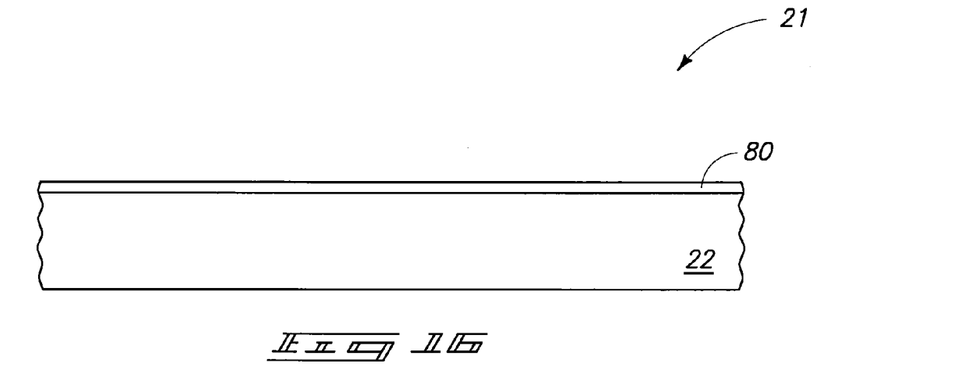
FIG. 16 is a diagrammatic, cross-sectional view of a template shown at a preliminary processing stage in accordance with an aspect of the invention different from that of FIG. 14.

FIG. 16 shows a template 21 at a preliminary processing stage at which adhesive material 80 is provided over the base 22. In aspects in which base 22 consists of quartz, adhesive material can, for example, consist of various eutectic alloys and/or glass grit. Such material can not only adhere to a surface of the quartz, but can also adhere to CdS or CdSe, and thus is suitable for retaining the catalytic material containing one or both of CdS and CdSe to the quartz base. The adhesive material 80 can be formed to any suitable thickness, and typically would be formed to a thickness of, for example, from about 10 Å to about 1000 Å; with the thickness of the adhesive being preferably less than the thickness of the catalytic material.

Figure 17:
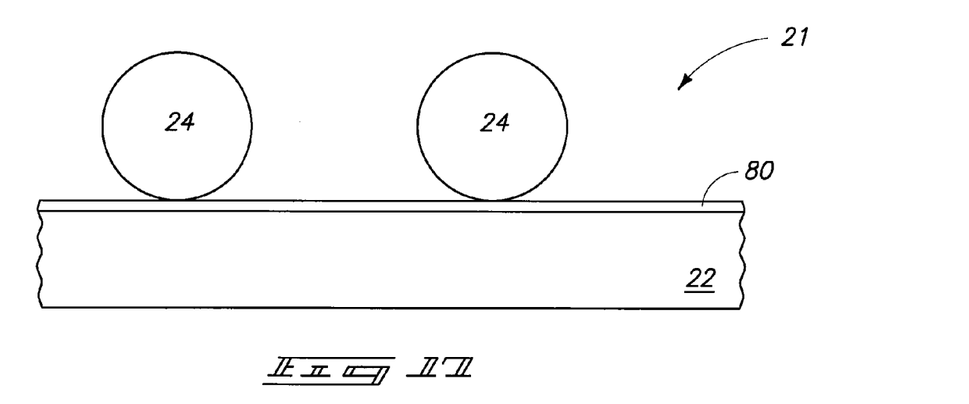
FIG. 17 is a view of the FIG. 16 template shown at a processing stage subsequent to that of FIG. 16.

Referring to FIG. 17, catalytic material 24 is shown adhered to adhesive material 80, and thus fixed to desired locations with the adhesive material. The catalytic material can be provided in desired locations across adhesive material 80 utilizing electrostatic interactions to move the catalytic material 24 to such desired locations.

Figure 18:
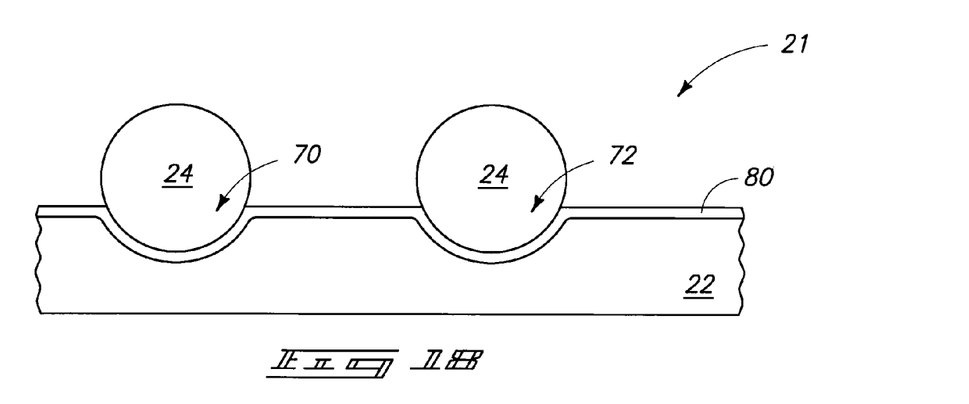
FIG. 18 is a diagrammatic, cross-sectional view of a template formed in accordance with yet another aspect of the present invention.

In some aspects, the wells of FIGS. 14 and 15 can be combined with the adhesive layer of FIGS. 16 and 17. Such is illustrated in FIG. 18, where a template 21 is shown to comprise the adhesive layer 80 extending within wells 70 and 72, and to comprise catalytic material 24 over the adhesive material 72, and also within the wells.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of patterning a first substrate, comprising:
providing a masking layer over the first substrate;
providing a template comprising patterned catalytic material bonded to a second substrate, the catalytic material comprising one or both of CdS and CdSe;
utilizing the catalytic material to modify some regions of the masking layer while leaving other regions unmodified, the modified regions being substantially in the pattern of the patterned catalytic material;
selectively removing one of the modified and unmodified regions relative to the other of the modified and unmodified regions to form a patterned mask from the masking layer; and
transferring a pattern from the patterned mask into the first substrate.

2. The method of claim 1 wherein the first substrate is a semiconductor substrate.

3. The method of claim 2 wherein the pattern from the patterned mask is transferred into a semiconductor material of the semiconductor substrate.

4. The method of claim 3 wherein the semiconductor material comprises silicon.

5. The method of claim 3 wherein the semiconductor material comprises monocrystalline silicon.

6. The method of claim 1 wherein the second substrate comprises quartz and wherein the catalytic material is adhered to the second substrate primarily through van der Waals forces.

7. The method of claim 1 wherein the second substrate comprises quartz and wherein the catalytic material is adhered to the second substrate with an adhesive that is bonded to both the quartz and the catalytic material.

8. The method of claim 1 wherein the second substrate comprises quartz and wherein the catalytic material is retained within openings in the quartz of the second substrate.

9. The method of claim 1 wherein the utilizing the catalytic material to modify some regions of the masking layer while leaving other regions unmodified comprises passing light through the second substrate and utilizing the light and the catalytic material for photocatalysis to modify said regions of the masking layer.

10. A method of patterning a plurality of substrates, comprising:
forming a template comprising patterned catalytic material bonded to a base, the catalytic material comprising one or both of CdS and CdSe;
providing a plurality of substrates having masking layers thereover;
utilizing the catalytic material to sequentially impart patterns in the masking layers of the substrates; the imparting of the patterns comprising modifying some regions of the masking layers while leaving other regions unmodified;
selectively removing either the modified or unmodified regions relative to the other of the modified and unmodified regions to form patterned masks from the masking layers; and
transferring the patterns from the patterned masks into the substrates.

11. The method of claim 10 wherein the base comprises quartz and wherein the patterned catalytic material is formed into the pattern by electrostatically moving the catalytic material to desired regions associated with the base, and then fixing the catalytic material to the desired regions.

12. The method of claim 10 wherein the base comprises quartz and wherein the catalytic material is adhered to the base primarily through van der Waals forces.

13. The method of claim 10 wherein the base comprises quartz and wherein the catalytic material is adhered to the base with an adhesive that is bonded to both the quartz and the catalytic material.

14. The method of claim 10 wherein the base comprises quartz and wherein the catalytic material is retained within openings in the quartz of the base.

15. The method of claim 10 wherein the utilizing the catalytic material to modify some regions of the masking layers while leaving other regions unmodified comprises passing light through the base and utilizing the light and the catalytic material for photocatalysis to modify said regions of the masking layers.

16. The method of claim 10 wherein the substrates are semiconductor substrates.

17. The method of claim 16 wherein the patterns from the patterned masks are transferred into semiconductor material of the semiconductor substrates.

18. The method of claim 17 wherein the semiconductor material comprises silicon.

19. The method of claim 17 wherein the semiconductor material comprises monocrystalline silicon.

20. A method of forming a template comprising adhering one or both of CdS and CdSe to a quartz base in a desired pattern; wherein the desired pattern is formed by electrostatically moving the one or both of the CdS and CdSe to desired regions associated with the base, and then fixing the one or both of the CdS and CdSe to the desired regions.

21. A method of forming a template comprising adhering one or both of CdS and CdSe to a quartz base in a desired pattern, wherein the one or both of the CdS and CdSe is adhered to the base primarily through van der Waals forces.

22. A method of forming a template comprising adhering one or both of CdS and CdSe to a quartz base in a desired pattern, wherein the one or both of the CdS and CdSe is adhered to the base with an adhesive that is bonded to both the quartz and the one or both of the CdS and CdSe.

* * * * *